(12) United States Patent
Onkar et al.

(10) Patent No.: US 9,985,608 B2
(45) Date of Patent: May 29, 2018

(54) SMALL AREA AND LOW POWER IIR FILTER STRUCTURE

(71) Applicant: ANALOG DEVICES GLOBAL, Hamilton (BM)

(72) Inventors: Sudarshan Onkar, Bengaluru (IN); Philip P. E. Quinlan, Glounthaune (IE); Kenneth J. Mulvaney, Coolaney (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 193 days.

(21) Appl. No.: 14/863,901

(22) Filed: Sep. 24, 2015

(65) Prior Publication Data
US 2017/0093375 A1    Mar. 30, 2017

(51) Int. Cl.
*H03H 17/02* (2006.01)
*H03H 17/04* (2006.01)

(52) U.S. Cl.
CPC ........ *H03H 17/0283* (2013.01); *H03H 17/04* (2013.01); *H03H 2017/0245* (2013.01); *H03H 2017/0488* (2013.01)

(58) Field of Classification Search
CPC .......... H03H 17/0283; H03H 17/0202; H03H 17/0219; H03H 17/0223; H03H 17/04; H03H 2017/0214; H03H 2017/0295; H03H 2017/0472–2017/0494
USPC ....................................................... 708/300
See application file for complete search history.

(56) References Cited

U.S. PATENT DOCUMENTS

| | | | |
|---|---|---|---|
| 5,745,856 A * | 4/1998 | Dent | H03G 5/24 455/266 |
| 6,178,211 B1 | 1/2001 | Whikehart et al. | |
| 6,178,314 B1 | 1/2001 | Whitehart et al. | |
| 6,445,735 B1 | 9/2002 | Whikehart | |
| 6,459,743 B1 | 10/2002 | Lipka | |
| 8,041,759 B1 * | 10/2011 | Langhammer | H03K 19/177 326/38 |

(Continued)

OTHER PUBLICATIONS

S.N. Simrock et al., "Considerations for the Choice of the Intermediate Frequency and Sampling Rate for Digital RF Control", Proceedings of EPAC 2006, Edinburgh, Scotland, 3 pages.

(Continued)

*Primary Examiner* — Michael D. Yaary
(74) *Attorney, Agent, or Firm* — Patent Capital Group

(57) ABSTRACT

Embodiments of the present disclosure provide a digital filter module for use in receivers, particularly suitable for use in a narrow-band electromagnetic receiver. Design of the module is based on a recognition that providing to the module samples of a signal received by a receiver and sampled at a sampling frequency equal to four times the intermediate frequency of the receiver, eliminating zeros in the filter, and implementing the filter module as a resource-shared second-order filter structure that includes two sections advantageously enables saving some hardware components, particularly some multipliers and adders, in implementing a versatile digital filter module that can function either as two real filters or one complex filter. In this manner, substantial reduction of area and power consumption of the filter module may be achieved, while maintaining sufficiently high filtering performance.

23 Claims, 11 Drawing Sheets

(56) References Cited

U.S. PATENT DOCUMENTS

| | | | | |
|---|---|---|---|---|
| 8,229,987 | B2* | 7/2012 | Hosokawa | H03D 7/125 |
| | | | | 341/122 |
| 8,406,357 | B2* | 3/2013 | Yamazaki | H04B 1/30 |
| | | | | 375/344 |
| 2002/0181614 | A1 | 12/2002 | Mostafa et al. | |
| 2003/0069911 | A1* | 4/2003 | Piirainen | H03H 17/0288 |
| | | | | 708/313 |
| 2003/0100286 | A1 | 5/2003 | Severson et al. | |
| 2005/0149592 | A1* | 7/2005 | Harvey | H03H 11/1217 |
| | | | | 708/300 |
| 2007/0047669 | A1* | 3/2007 | Mak | H03D 3/007 |
| | | | | 375/316 |
| 2010/0198898 | A1* | 8/2010 | Pan | H03H 15/023 |
| | | | | 708/313 |
| 2011/0113082 | A1* | 5/2011 | Alimohammad | H03H 17/0292 |
| | | | | 708/316 |
| 2011/0235753 | A1* | 9/2011 | Horisaki | H04L 5/0039 |
| | | | | 375/340 |
| 2012/0314881 | A1 | 12/2012 | Burge et al. | |

OTHER PUBLICATIONS

Richard Lyons, "Improved Narrowband Low-Pass IIR Filters in Fixed-Point Systems", dspTips&Tricks, Digital Object Identifier 10.1109/MSP.2008.914713, IEEE Signal Processing Magazine, Mar. 2009, 3 pages.

Application Note (ASN-AN021), "Designing and Implementing Biquad IIR Filters with the ASN Filter Designer: a Tutuorial Review", Advanced Solutions Nederland, Oct. 2015 (Rev 2), 7 pages.

Ashwini D. et al., "Design of Programmable Digital Filter: Band Pass Using Second Order All Pass Transformation and Coefficient Decimation", International Journal of Innovative Research & Development, ISSN 2278-0211 (online), www.ijird.com, Jun. 2014, vol. 3 Issue 6, 4 pages.

Digital Filter Design Guide, FIR and IIR, Frequency Devices, Inc., Ottawa, IL, www.freqdev.com downloaded from Internet Oct. 5, 2015, 11 pages.

Nikola Stojanović et al., "All-Pole Recursive Digital Filters Design Based on Ultraspherical Polynomials", Radioengineering, vol. 23, No. 3, Sep. 2014, 5 pages.

Miloš Drutarovský, "An Implementation of High Performance IIR Filtration on 2-MAC Blackfin DSP Architecture", ResearchGate, Jan. 2005, 5 pages.

Mark Rives, "Intermediate Frequency (IF) Sampling Receiver Concepts", Analog Edge, vol. IV, Issue 3, © 2006, 6 pages.

* cited by examiner

* $If\ \theta = 90,\ Z^{-1} \rightarrow Z^{-1}e^{j\theta} = Z^{-1}(cos\theta + jsin\theta) = Z^{-1}(0+j) = jZ^{-1}$

| 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|
| Sign | $2^{-1}$ | $2^{-2}$ | $2^{-3}$ | $2^{-4}$ | $2^{-5}$ | $2^{-6}$ | $2^{-7}$ | $2^{-8}$ | $2^{-9}$ | $2^{-10}$ | $2^{-11}$ | $2^{-12}$ | $2^{-13}$ | $2^{-14}$ | $2^{-15}$ |

FIGURE 9A

| 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|
| Sign | $2^{-11}$ | $2^{-12}$ | $2^{-13}$ | $2^{-14}$ | $2^{-15}$ | $2^{-16}$ | $2^{-17}$ | $2^{-18}$ | $2^{-19}$ | $2^{-20}$ | $2^{-21}$ | $2^{-22}$ | $2^{-23}$ | $2^{-24}$ | $2^{-25}$ |

FIGURE 9B

SMALL AREA AND LOW POWER IIR FILTER STRUCTURE

TECHNICAL FIELD OF THE DISCLOSURE

The present invention relates to the field of digital signal processing, in particular to small area and low power digital filters.

BACKGROUND

As is well known, an electromagnetic receiver is an electronic device that receives electromagnetic waves in a certain range of frequencies and converts the information carried by these waves into some kind of a usable form. For example, a receiver that is typically referred to as a "radio receiver" receives electromagnetic waves in the radio range of approximately 3 kiloHertz (kHz) to 300 gigaHertz (GHz). All receivers use antennas to capture the waves and convert them to alternating current (AC) signals, and electronic filters to separate the signals in the desired band of frequencies from all other signals that may be captured by the antenna. In context of receivers, different bands of frequencies are sometimes referred to as a "channels."

Selectivity performance of a receiver refers to a measure of the ability of the receiver to separate the desired band of frequencies from unwanted interfering signals received at other frequencies. In other words, selectivity defines how effectively a receiver can respond only to the signal of interest that it is tuned to (i.e., signal in the desired band of frequencies) and reject signals in other frequencies. Adjacent Channel Rejection (ACR) and Image Rejection (IR) are two key specifications that directly impact selectivity of a receiver.

Narrow-band (NB) receivers are receivers that are supposed to only detect signals in one or more relatively narrow bands of frequencies, e.g. 3-25 kHz for a radio receiver, while rejecting signals outside of these bands of interest. ACR and IR requirements for receivers targeting NB applications are very stringent because NB receivers demand high attenuation. Implementing an analog only filter is problematic, and arguably not even feasible, because it requires using prohibitively large area on an Integrated Circuit (IC) chip. At the same time, implementing a digital filter for NB receivers, in particular a digital filter that yields high performance, requires relatively small area to be implemented on a chip, and consumes relatively low power, is an extremely challenging task. Improvements could be made with respect to addressing this issue.

Overview

Embodiments of the present disclosure provide mechanisms that enable implementing an electronic filter that may improve on one or more problems described above, in particular with respect to the use of such a filter in NB receivers where the filter would have sufficiently high performance capable of abiding by the stringent ACR and IR requirements of NB receivers while requiring relatively small area and low power. Accordingly, embodiments of the present disclosure provide a digital filter module for use in a receiver, particularly for use in a narrow-band receiver. Design of the module is based on a recognition that providing to the module samples of a signal received by a receiver and sampled at a sampling frequency equal to four times the intermediate frequency of the receiver, eliminating zeros in the filter, and implementing the filter module as a resource-shared second-order filter structure that includes two sections advantageously enables saving some hardware components, particularly some multipliers and adders, in implementing a versatile digital filter module that can function either as two real filters or one complex filter. In this manner, substantial reduction of area and power consumption of the filter module may be achieved, while maintaining sufficiently high filtering performance. Furthermore, implementing the filter structure as infinite impulse response (IIR) filter allows advantageously saving the number of computations.

Accordingly, one aspect of the present disclose provides a digital filter module for use in a receiver, e.g. a narrow-band receiver. The filter module includes a resource-shared, at least second-order (possibly higher-order), filter structure referred to herein either as a "SOS" (for "Second Order Structure") or a "bi-quad structure". The SOS is configured to operate, in a first mode, as an all-pole complex IIR filter, and, in a second mode, as two real all-pole IIR filters. The filter module further includes a mode switch configured to set a mode of operation of the SOS to the first mode or the second mode, e.g. by providing a control signal to the SOS to switch mode of operation of the SOS between the first mode and the second mode. The SOS includes a first section and a second section, where the first section is configured to receive digital samples representing real parts of a signal received by the receiver and the second section is configured to receive digital samples representing imaginary parts of the signal received by the receiver. The digital samples received by the SOS are sampled at a sampling frequency equal to four times the intermediate frequency of the receiver.

In some embodiments, each of the first and second sections may include a scaling multiplier, an adder, one or more first memory elements, a first multiplier, and a selector.

In such embodiments, in the first mode of operation described herein, the digital samples representing the real parts of the signal may be processed, sequentially, by the scaling multiplier of the first section (UMS), the adder of the first section (UA), the one or more first registers of the first section (UD11-UD1k), the first multiplier of the first section (UM1), the selector of the second section (LS) configured to select an output of the first multiplier of the first section (UM1) (as a consequence of the mode of operation being set to the first mode, e.g. as a result of the selector receiving a control signal indicating the first mode of operation), and the adder of the second section (LA). On the other hand, the digital samples representing the imaginary parts of the signal may be processed, sequentially, by the scaling multiplier of the second section (LMS), the adder of the second section (LA), the one or more first registers of the second section (LD11-LD1k), the first multiplier of the second section (LM1), the selector of the first section (US) configured to select an output of the first multiplier of the second section (LM1) (as a consequence of the mode of operation being set to the first mode, e.g. as a result of the selector receiving a control signal indicating the first mode of operation), and the adder of the first section (UA).

In one further embodiment, each of the first and second sections may further include one or more second single-sample delay registers (UD21-UD2k; LD21-LD2k) and a second multiplier (UM2; LM2). In such an embodiment, in the first mode, the adder of the first section (UA) may be configured to add the output of the first multiplier of the second section (LM1) (because this output is selected by the selector of the first section (US)) to an output of processing the digital samples representing the real parts of the signal, sequentially, by the scaling multiplier of the first section (UMS), the one or more second registers of the first section (UD21-UD2k) and the second multiplier of the first section (UM2). On the other hand, the adder of the second section (LA) may be configured to add the output of the first multiplier of the first section (UM1) (because this output is selected by the selector of the second section (LS)) to an output of processing the digital samples representing the imaginary parts of the signal, sequentially, by the scaling multiplier of the second section (LMS), the one or more second registers of the second section (LD21-LD2k) and the second multiplier of the second section (LM2).

In some embodiments, in the second mode of operation described herein, the digital samples representing the real parts of the signal may be processed, sequentially, by the scaling multiplier of the first section (UMS), the adder of the first section (UA), the one or more first registers of the first section (UD11-UD1k), the first multiplier of the first section (UM1), the selector of the first section (US) configured to select an output of the first multiplier of the first section (UM1) (as a consequence of the mode of operation being set to the second mode, e.g. as a result of the selector receiving a control signal indicating the second mode of operation), and the adder of the first section (UA). The digital samples representing the imaginary parts of the signal may be processed, sequentially, by the scaling multiplier of the second section (LMS), the adder of the second section (LA), the one or more first registers of the second section (LD11-LD1k), the first multiplier of the second section (LM1), the selector of the second section (LS) configured to select an output of the first multiplier of the second section (LM1) (as a consequence of the mode of operation being set to the second mode, e.g. as a result of the selector receiving a control signal indicating the second mode of operation), and the adder of the second section (LA).

In one further embodiment, each of the first and second sections may further include one or more second single-sample delay registers (UD21-UD2k; LD21-LD2k) and a second multiplier (UM2; LM2). In such an embodiment, in the second mode, the adder of the first section (UA) may be configured to add the output of the first multiplier of the first section (UM1) (because this output is selected by the selector of the first section (US)) to an output of processing the digital samples representing the real parts of the signal, sequentially, by the scaling multiplier of the first section (UMS), the one or more second registers of the first section (UD21-UD2k) and the second multiplier of the first section (UM2). On the other hand, the adder of the second section (LA) may be configured to add the output of the first multiplier of the second section (LM1) (because this output is selected by the selector of the second section (LS)) to an output of processing the digital samples representing the imaginary parts of the signal, sequentially, by the scaling multiplier of the second section (LMS), the one or more second registers of the second section (LD21-LD2k) and the second multiplier of the second section (LM2).

In some embodiments, each of the first and second sections of the resource-shared second order filter structure may be implemented as a Butterworth filter or a Chebyshev type I filter.

In some embodiments, the digital filter module may be configured to operate as a 2k-order filter, where k is an integer equal to or greater than 1.

In another aspect, a receiver, e.g. an electromagnetic receiver, particularly a radio receiver, including a digital filter module as described herein, is disclosed.

In some embodiments, the digital filter module may be configured to filter the signal received by the receiver by rejecting or decreasing signal components outside of a first band of frequencies, the receiver further comprising an analog filter configured to filter the signal received by the receiver by rejecting or decreasing signal components outside of a second band of frequencies, the second band of frequencies being larger than the first band of frequencies. For example, the first band of frequencies could be a band between 3 kHz and 25 kHz.

In some embodiments, the receiver may be configured to be operated in a narrow-bandwidth mode and in a wide-bandwidth mode, the receiver further comprising a controller for using, in the narrow-bandwidth mode, the digital filter module to filter the signal received by the receiver, and for using, in the wide-bandwidth mode, the analog filter to filter the signal received by the receiver.

As will be appreciated by one skilled in the art, aspects of the present disclosure may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." At least some functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing receivers or controllers of such receivers, etc.) or be stored upon manufacturing of these devices and systems.

Other features and advantages of the disclosure are apparent from the following description, and from the claims.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which:

FIGS. 9A and 9B provide a schematic illustration of one example of a fixed point number system used, according to some embodiments of the disclosure;

DESCRIPTION OF EXAMPLE EMBODIMENTS OF THE DISCLOSURE

Channel Filtering

Figure 1:
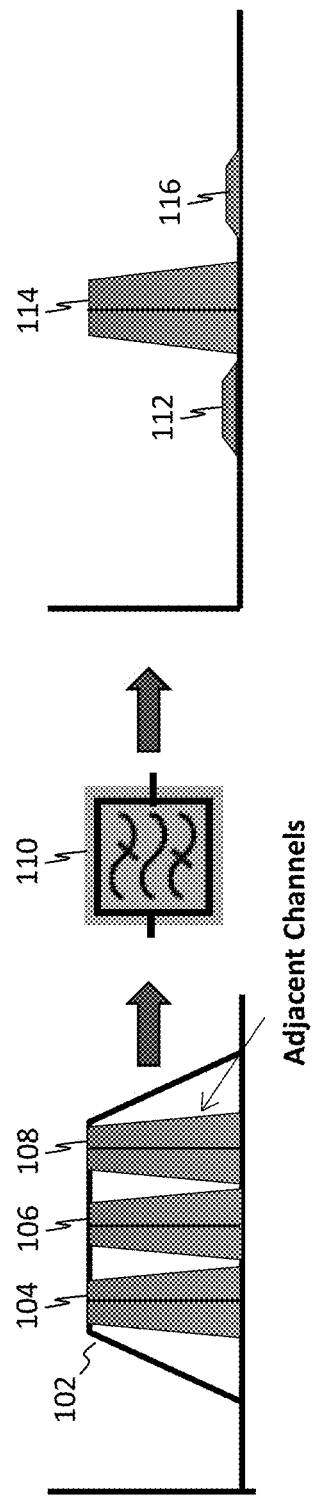
FIG. 1 provides an illustration of channel filter functionality, according to some embodiments of the disclosure.

Embodiments of the present disclosure relate to digital filters that allow passing digital values associated with contributions to the signal detected by a receiver in a desired frequency band (channel) of interest, while cancelling, reducing, or rendering below the noise threshold of the detection mechanism contributions to the received signal at frequencies other than those in the band of interest. FIG. 1 provides an illustration of channel filter functionality, according to some embodiments of the disclosure. As shown in FIG. 1, a receiver may receive a signal 102 that contains contributions in different frequency bands, shown in the example of FIG. 1 as three adjacent channels 104, 106, and 108. The received signal 102 may then be provided to a channel filter 110, such as e.g. the digital filter module described herein, which would process the signal 102 to pass contributions in a particular band of frequencies, as shown in FIG. 1 with band 114, and cancel, reduce, or render below the noise contributions of the adjacent channels, as shown in FIG. 1 with bands 112 and 116.

System View of an Improved Receiver and Digital Filter Module

Figure 2:
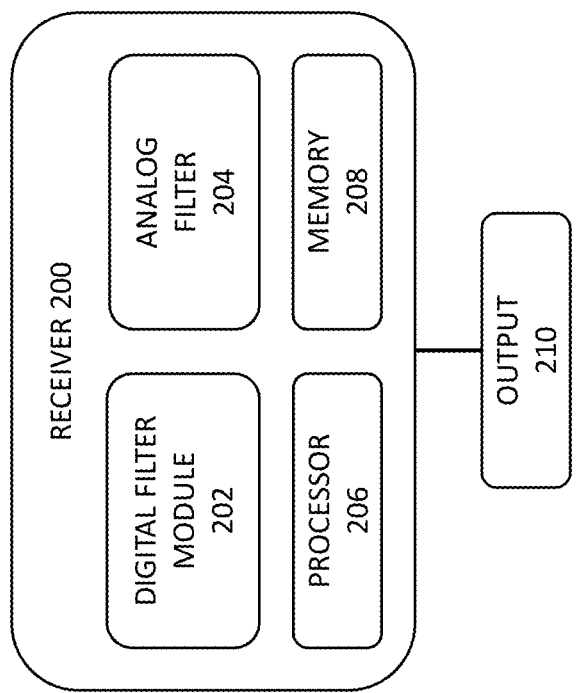
FIG. 2 provides a schematic illustration of a receiver, according to some embodiments of the disclosure.

FIG. 2 provides a schematic illustration of a receiver 200, according to some embodiments of the disclosure. As shown, the receiver 200 may include a digital filter module 202 as well as, optionally, an analog filter 204, a processor 206, and a memory 208. The digital filter module 202 is configured to receive digital samples of a signal received by a receiver 200 to generate an output 210. The digital filter module 202 may be used for wide-band (WB) applications, but is particularly suitable for NB applications. For WB applications, the analog filter 204 may be used, which could be implemented as any kind of analog WB filter as known in the art. The processor 206 and the memory 208 of the receiver 200 may be configured to implement various parts of the filtering carried out by the digital filter module 202, such as e.g. bandwidth programmability or provision of a control signal to switch mode of operation, as described herein.

It should be noted that, in order to not clutter the drawing, receiver 200 illustrates signal processing components of a receiver and does not illustrate other components which are typically present in receivers. For example, a person of ordinary skill in the art would recognize that the receiver 200 may further include one or more antennas for receiving signals, an integrated circuit that can provide an analog front end for receiving signals and converting analog input signals to digital data samples of the analog input signal, various interface ports, etc. In an embodiment, an analog front end can be configured to communicate with the processor 206 to provide digital data samples, which the processor 206 would process to filter contributions within the channel of interest.

The processor 206 can include several special application specific parts or modules for processing the data. The processor 206 can include electronic circuits, programmable logic gates, specially arranged for processing the data samples of the input signal to filter contributions within the channel of interest. The processor 206 can be a digital signal processor provided with application specific components filter contributions within the channel of interest, and/or the processor can execute special instructions (stored on non-transitory computer readable-medium) for carrying out at least parts of the method of filtering signal contributions within the channel of interest.

Figure 3:
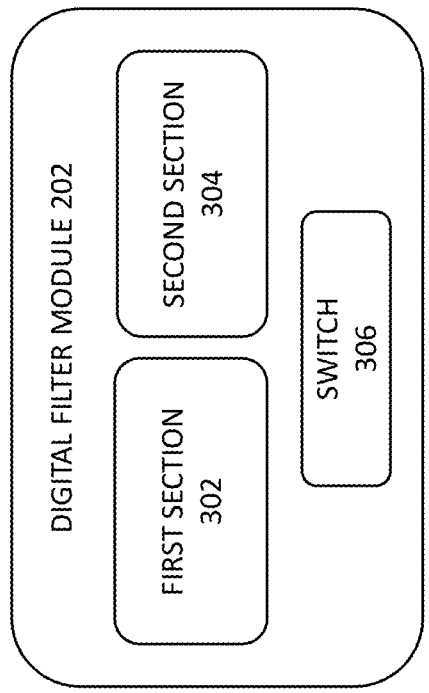
FIG. 3 provides a schematic illustration of a digital filter module, according to some embodiments of the disclosure.

FIG. 3 provides a schematic illustration of a digital filter module, such as e.g. the digital filter module 202 shown in FIG. 2, according to some embodiments of the disclosure. At a high level, the digital filter module 202 includes a first section 302, a second section 304, and a mode switch 306. The first section 302 is configured to receive, at its input, digital samples representing real parts of the signal received by the receiver 200. The second section 304 is configured to receive, at its input, digital samples representing imaginary parts of the signal received by the receiver 200. The mode switch 306 is configured to set a mode of operation of the digital filter module 202 to the first mode or the second mode.

An exemplary digital filter module is now described in greater detail with reference to a radio receiver. However, teachings provided herein are equally applicable to digital filter modules configured to filter electromagnetic signals in other frequency ranges (e.g. in the optical range). Furthermore, these teachings are applicable to digital filtering of signals detected by receivers other than electromagnetic receivers, such as e.g. sonar receivers.

The following passages describe in further detail how the improved narrow band digital filtering mechanism can be implemented and realized.

An Exemplary Digital Filter Module and Method

Figure 4:
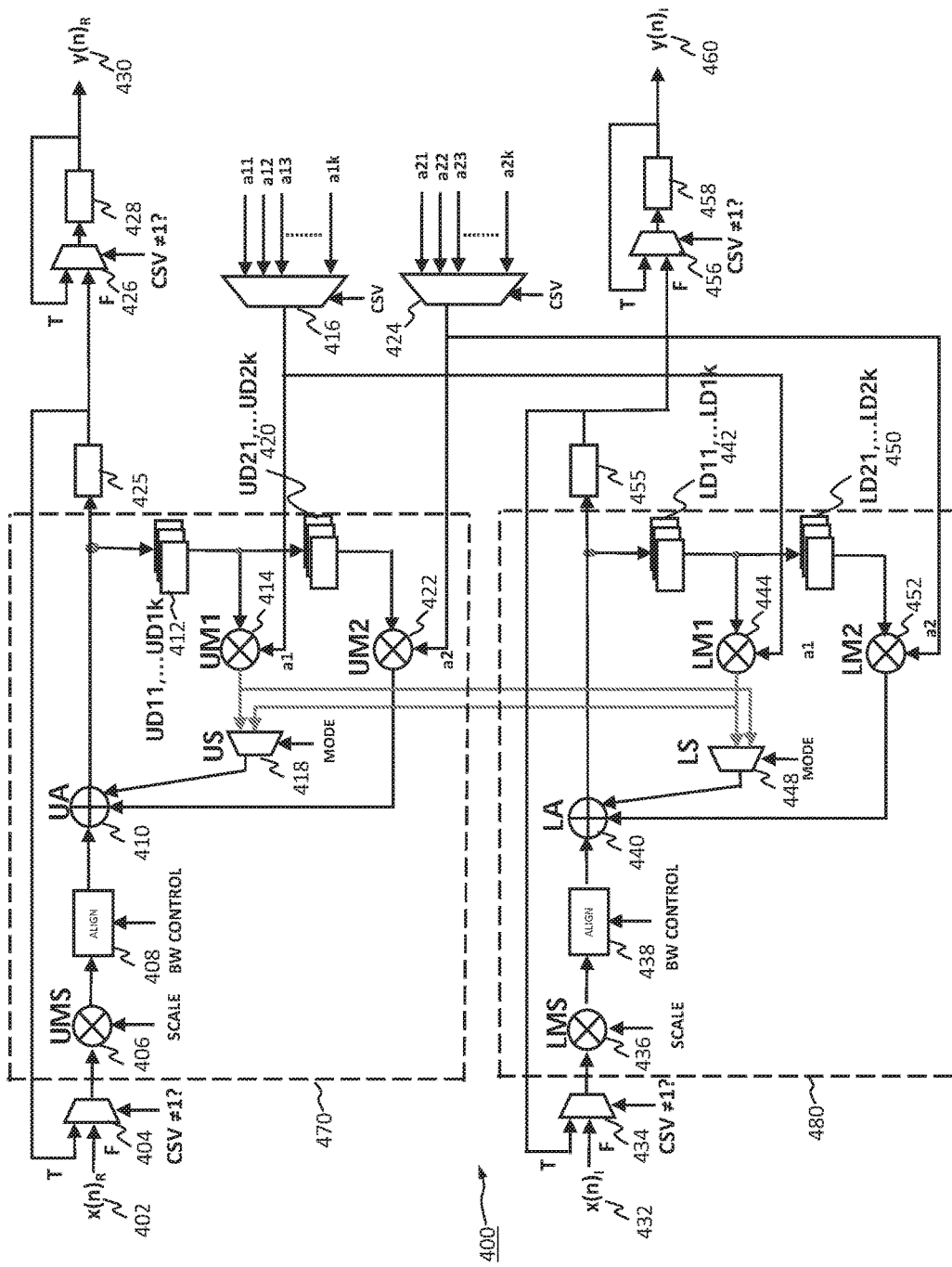
FIG. 4 provides a schematic illustration of an exemplary implementation of a digital filter module, according to some embodiments of the disclosure.

FIG. 4 provides a schematic illustration of an exemplary implementation of a resource-shared second-order filter structure (SOS) of a digital filter module 400, according to some embodiments of the disclosure. The SOS shown in FIG. 4 may be implemented within the digital filter module 202 of the receiver 200.

The core of the filtering functionality of digital filter module SOS 400 may be considered to include components shown within a first section 470 and components shown within a second section 480. The first section 470 may be referred to as an "upper section" and, therefore, components shown within that section in FIG. 4 include letter "U" (for "Upper"), while the second section 480 may be referred to as a "lower section" and, therefore, components shown within that section in FIG. 4 include letter "L" (for "Lower"). This notation is used merely for distinguishing the components of these two sections and does not imply actual upper/lower implementation of the two sections.

A resource-shared bi-quad implementation such as shown in FIG. 4 was employed to reduce the area of high order filters, where the term "resource-shared" refers to the fact that combinational resources such as e.g. UM1, UM2, are shared among different rounds of SOS described below.

In some embodiments, the first section 470 may be implemented as the first section 302 shown in FIG. 3, while the second section 480 may be implemented as the second section 304 shown in FIG. 3.

The digital filter module 400 is configured to receive digital samples of the signal received by the receiver 200, sampled at a sampling frequency (Fs) equal to four times the intermediate frequency (IF) of the receiver 200, the significance of which is described in greater detail below. In particular, the first section 470 is configured to receive digital samples representing real parts of the signal received by the receiver, shown as samples $x(n)_R$ 402 in FIG. 4, while the second section 480 is configured to receive digital samples representing imaginary parts of the signal received by the receiver, shown as samples $x(n)_I$ 432 in FIG. 4.

As a person of ordinary skill in the art will recognize, a second-order filter structure, also referred to as a "bi-quad", may be used to implement any $2k^{th}$-order filter, where k is an integer equal to or greater than 1, by processing the data samples in k rounds. For example, in order to implement a 10th-order filter (i.e. k=5), data samples are processed by the filter in 5 rounds. A variable referred to herein as a "current SOS value" (CSV) may be used to keep track of the number of rounds of processing. For the example described below, consider that the variable CSV is a counter that can take on integer values from 1 to k (thus, for a $10^{th}$-order filter the values of 1, 2, 3, 4, and 5), i.e. the CSV in this example is counting upwards. Such a counter may be configured to take on a value of 1 again after the round with the value of k is over.

In the example of CSV counting rounds from 1 to k, the digital samples 402 representing real parts of the signal received by the receiver are provided to a selector 404, while the digital samples 432 representing imaginary parts of the signal received by the receiver are provided to a selector 434. Each of the selectors 404 and 434 receives a CSV in order to evaluate whether CSV is not equal to 1. Alternatively, each of the selectors 404 and 434 receives a result of such evaluation performed by another entity not shown in FIG. 4, e.g. performed by the processor 206 shown in FIG. 2.

When it is determined that CSV is equal to 1 (i.e. the statement "CSV≠1" is evaluated as "FALSE"), the selectors 404 and 434 are configured to select and pass to the respective section the input digital sample 402 or 432, respectively, as shown in FIG. 4 with a letter "F" (for "FALSE") from the digital sample 402 to the selector 404 for the first section 470 and from the digital sample 432 to the selector 434 for the second section 480.

When it is determined that CSV is not equal to 1 (i.e. the statement "CSV≠1" is evaluated as "TRUE"), for the first section 470, the selector 404 is configured to select and pass to the first section the value generated by an adder of the first section 470 (shown as an UA 410, for "Upper Adder") and stored in a memory element (e.g. a register) 425, as shown in FIG. 4 with a letter "T" (for "TRUE") on an arrow going to the selector 404. Similarly, for the second section 480, when it is determined that CSV is not equal to 1, the selector 434 is configured to select and pass to the second section the value generated by an adder of the second section 480 (shown as an LA 440, for "Lower Adder") and stored in a memory element (e.g. a register) 455, as shown in FIG. 4 with a letter "T" (for "TRUE") on an arrow going to the selector 434.

In this manner, the selectors 404 and 434 are configured to pass a new respective digital sample to the first and second section for processing when CSV is equal to 1 (which indicates that k rounds of processing the previous digital sample are over) and otherwise process the digital sample values resulting from the previous rounds of processing when CSV is not equal to 1 (which indicates that still some rounds of processing the previous digital sample need to be carried out).

Corresponding selectors 426 and 456 may be implemented in order to ensure that following k rounds of processing, processed digital samples are provided at the output of the first and second sections of the digital filter module 400, shown in FIG. 4 as an output digital sample $y(n)_R$ 430 for the first section 470 and as an output digital sample $y(n)_I$ 460 for the second section 480. To that end, similar to the selectors 404 and 434, each of the selectors 426 and 456 receives a CSV in order to evaluate whether CSV is not equal to 1 (the exemplary implementation shown in FIG. 4 assumes that CSV changes after a round of processing in a respective section is over, e.g. after the results of processing are stored in the registers 425, 455). Alternatively, each of the selectors 426 and 456 receives a result of such evaluation performed by another entity not shown in FIG. 4, e.g. performed by the processor 206 shown in FIG. 2.

When it is determined that CSV is equal to 1 (i.e. the statement "CSV≠1" is evaluated as "FALSE"), the selectors 426 and 456 are configured to select and provide at the output of the respective section the last digital value generated by the respective adder UA 410 or LA 440 and stored in the respective register 425 or 455, as shown in FIG. 4 with a letter "F" (for "FALSE") from the register 425 to the selector 426 for the first section 470 and from the register 455 to the selector 456 for the second section 480. The new output digital value for the first section 470 may then be stored in a memory element (e.g. a register) 428, and the new output digital value for the second section 480 may then be stored in a memory element (e.g. a register) 458.

When it is determined that CSV is not equal to 1 (i.e. the statement "CSV≠1" is evaluated as "TRUE"), for the first section 470, the selector 426 is configured to select and provide at the output of the first section the last output digital value stored in the register 428, as shown in FIG. 4 with a letter "T" (for "TRUE") on an arrow going to the selector 426. Similarly, for the second section 480, when it is determined that CSV is not equal to 1, the selector 456 is configured to select and pass to the second section the last output digital value stored in the register 458, as shown in FIG. 4 with a letter "T" (for "TRUE") on an arrow going to the selector 456.

In this manner, the selectors 426 and 456 are configured to provide a new respective digital sample as an output of the first and second section when CSV is equal to 1 (which indicates that k rounds of processing the previous digital sample are over) and otherwise provide the last digital sample as an output when CSV is not equal to 1 (which indicates that still some rounds of processing the next, current input digital sample need to be carried out).

A person of ordinary skill in the art will immediately recognize a particular implementation of the selectors 404, 434, 426, and 456, the particular manner in which CSV is updated, and the particular decisions evaluated to TRUE or FALSE to be used by the selectors shown in FIG. 4 provide one non-limiting example. There are various other manners in which a digital filter module may be implemented to ensure that each input digital sample undergoes k rounds of processing prior to being provided as an output of the module. For example, when the CSV is updated in a different manner (e.g. counting from k to 1), the decisions that need to be evaluated to TRUE or FALSE will change correspondingly. The decisions may also change when an update of a CSV occurs at a different point in time within the data flow shown in FIG. 4. Since these variations will be obvious to a person of ordinary skill in the art based on the description provided herein, all of the other manners in which a digital filter module may be implemented to ensure that each input digital sample undergoes k rounds of processing prior to being provided as an output of the module are within a scope of the present disclosure.

Also related to k rounds of processing of a $2k^{th}$-order filter are selectors 416 and 424 configured to provide to each of the sections 470 and 480 values of two filter coefficients a1 and a2 (two values are shown in FIG. 4 and described here because a second-order filter structure is described herein; if e.g. a fourth-order filter structure was assumed, four coefficients would be provided). The following passage provided a brief description of filter coefficients, known to persons of ordinary skill in the art.

A filter conditions an incoming signal and produces an output signal having certain selected or controlled characteristics, e.g. producing a signal comprising contributions in a certain channel of frequencies. A transfer function H of a filter determines the output and the characteristics of a filter. When expressed in a digital form, a transfer function H of a filter may be written as a rational function of a variable z. A denominator D(z) of such function is a factorized polynomial expressed with variable z and coefficients $a_0, a_1, \ldots a_n$. A numerator N(z) of such function is a factorized polynomial expressed with variable z and coefficients $b_0, b_1, \ldots b_m$. Coefficients $a_0, a_1, \ldots a_n$ and $b_0, b_1, \ldots b_m$ of a filter determine its characteristics and output. The a-coefficients (i.e., a1 and a2) define pole locations of a filter. The b-coefficients (i.e., b0, b1 and b2) define zero locations of a filter. Poles refer to the roots of an equation D(z)=0. Zeros refer to the roots of an equation N(z)=0. Poles and zeros of a filter define a frequency response of a filter. The order of a filter determines the number of coefficients. Typically, e.g. for a second-order filter structure, two pole coefficients a1 and a2 and three zero coefficients b0, b1 and b2 are used.

The selector 416 is configured to provide to a first multiplexer of each section (the first multiplexer shown as an UM1 414 for the first section 470 and as an LM1 444 for the second section 480) a first coefficient a1 for use in a particular round of processing. This is shown in FIG. 4 with an arrow labeled with "a1" going from the selector 416 to the UM1 and LM1. To that end, the selector 416 is configured to receive k first coefficients a1, shown in FIG. 4 as coefficients a11, a12, a13, . . . , a1k provided to the selector 416, as well as the CSV, shown with an arrow labeled "CSV" provided to the selector 416, and select one of the coefficients to provide to the first multiplier in each section based on the CSV. For example, when the CSV is equal to 3, indicating the 3d round of processing of e.g. a $10^{th}$-order filter, the selector 416 will select the first coefficient a13 to provide to UM1 and LM1.

Similarly, the selector 424 is configured to provide to a second multiplexer of each section (the second multiplexer shown as an UM2 422 for the first section 470 and as an LM2 452 for the second section 480) a second coefficient a2 for use in a particular round of processing. This is shown in FIG. 4 with an arrow labeled with "a2" going from the selector 424 to the UM2 and LM2. To that end, the selector 424 is configured to receive k second coefficients a2, shown in FIG. 4 as coefficients a21, a22, a23, . . . , a2k provided to the selector 424, as well as the CSV, shown with an arrow labeled "CSV" provided to the selector 424, and select one of the coefficients to provide to the second multiplier in each section based on the CSV. For example, when the CSV is equal to 3, indicating the 3d round of processing of e.g. a $10^{th}$-order filter, the selector 424 will select the second coefficient a23 to provide to UM2 and LM2.

Inventors of the present disclosure found out during bit width analysis that two extra bits were needed to keep the signal within range avoiding overflow, as worst case gain is 1+2+1=4. So the filter was optimized further by completely removing the zeros which were not contributing to the attenuation much and saving two bits at the input of the bi-quad. Thus an all pole complex IIR filter was proposed for implementation of the digital filter module 400 (i.e., no zeros and b coefficients are used).

In some embodiments, filter coefficients a1 and a2 may be predefined. In other embodiments, filter coefficients a1 and a2 may be dynamically determined, e.g. when a specific output may be desired, but the coefficients of the filter cannot be determined at the onset. For such applications, one option may be to rely on adaptive filtering techniques, where an adaptive filter refers to a time-varying filter whose coefficients are adjusted in a way to optimize a cost function or to satisfy some predetermined optimization criterion.

In various embodiments, the filter coefficients may be real (resulting in what is typically referred as a "real filter") or complex (resulting in what is typically referred to as a "complex filter"). To implement both ACR and IR in a digital filter, the filter needs to employ complex coefficients (i.e. complex digital filter). Consequently, one of the mode of operation of the filter module 400 involved operating the structure as a complex filter.

Preferably, each of the first and second sections 470, 480 of the filter module 400 is implemented as a Butterworth filter or a Chebyshev type I filter. For these filters the three zero-coefficients are b0=1, b1=2, and b2=1, which could be implemented without any multipliers but only using shifters, which is advantageous. However, in order to further optimize the bi-quad filter structure, these zero coefficients could be completely removed. One reason for removing these coefficients is that, for the resource shared bi-quad to work properly, all input stage precision needs to be kept the same. When zeroes are present, such as e.g. the b0, b1, and b2 coefficients of a Butterworth filter or a Chebyshev type I filter, extra scaling of ¼ at the output of the bi-quad becomes necessary in order to keep the signal in +/−1 range. This adds complexity to the filter structure. Inventors of the present disclosure realized that the contribution of zero coefficients is negligible to overall filter attenuation in stop-band and that, therefore, in some implementations, these coefficients can be completely removed, thus eliminating the need for extra 2 bits to account for scaling. In other implementations, the resource shared bi-quad as described herein may be implemented with zeros, as long as additional logic for intelligent scaling is provided. A person of ordinary skill in the art would immediately recognize how to implement such logic based on the discussions provided herein.

Alternatively, each of the first and second sections 470, 480 of the filter module 400 may be implemented as any other filter that can function as an all-pole filter.

Also related to k rounds of processing of a $2k^{th}$-order filter are k memory elements 412 (shown in FIG. 4 as delay elements UD11, UD12, . . . UD1k 412) and k memory elements 420 (shown in FIG. 4 as delay elements UD21, UD22, . . . UD2k 420) configured to individually store results of processing of each round following the operation of the adder 410 of the first section 470. The same samples needs to be stored as they have to be delayed to implement $z^{-1}$ of the transfer function.

Similarly, k memory elements 442 (shown in FIG. 4 as delay elements LD11, LD12, . . . LD1k 442) and k memory elements 450 (shown in FIG. 4 as delay elements LD21, LD22, . . . LD2k 450) are configured to individually store results of processing of each round following the operation of the adder 440 of the second section 480.

In some embodiments, the memory elements 412, 420, 442, and 450 may be implemented as single-sample delay registers.

The digital filter module further includes a mode switch configured to set a mode of operation of the resource-shared second-order filter structure to either a first mode or a second mode of operation, advantageously adding great value by providing configurability.

Such a mode switch is configured to control operation of the resource-shared second-order filter structure 400 in order to use the same structure to perform different filtering functions in the following modes. In what is referred to as a "first mode" described herein, the resource-shared second-order filter structure is configured to operate as an all-pole complex IIR filter. In what is referred to as a "second mode" described herein, the resource-shared second-order filter structure is configured to operate as two all-pole real IIR filters. As described in greater detail below, the first and second modes differ in the paths the digital samples take in being processed by the resource-shared second-order filter structure.

There are different considerations as to when to operate the resource-shared second-order filter structure in the first mode and when to operate the structure in the second mode. For example, real filtering option may be advantageously used in cases when it's desirable to switch to a direct conversion receiver or in certain applications which do not have stringent ACR/IR requirements. For typical electromagnetic receivers this configuration is static, but for other applications the configuration of first mode vs second mode operation could be changed dynamically and/or changed after resetting the filter before changing the switch.

In various embodiments, functionality provided by such a mode switch may be implemented different manners—e.g. in hardware, software, a combination of software and hardware, etc. FIG. 4 illustrates one example of implementing such a mode switch in hardware by implementing the mode switch as a selector US 418 in the first section 470 and a selector LS 448 in the second section 480.

Each of the selectors 418 and 448 may be configured to receive an indication of the current mode of operation (as e.g. set by a user at the time of deployment of the filter module 400 or dynamically determined depending on the nature of input signal to be filtered), as indicated in FIG. 4 with an arrow "MODE" provided to the selectors 418 and 448. In an embodiment, the current mode of operation could be received in a form of a control signal provided to the selectors 418 and 448. Each of the selectors 418 and 448 are then configured to select and pass to the respective adder 410 or 440 one of the other two inputs to the selectors 418 and 448 (shown in FIG. 4 with other two arrows to these selectors). In particular, the selector 418 is configured to select and pass to the adder UA 410, in the first mode—the output of the first multiplexer LM1 of the second section 480, and, in the second mode—the output of the first multiplexer UM1 of the first section 470. The selector 448 is configured to select and pass to the adder LA 440, in the first mode—the output of the first multiplexer UM1 of the first section 470, and, in the second mode—the output of the first multiplexer LM1 of the second section 480.

As also shown in FIG. 4, the digital filter module 400 further includes a scaling module UMS 406 and, optionally, an align logic 408 in the first section 470 as well as a scaling module LMS 436 and, optionally, an align logic 438 in the second section 480, described in greater detail below in a section discussing optional bandwidth programmability of the digital filter module 400.

Further, the digital filter module 400 implements IIR filter structure (which is apparent in FIG. 4 by the presence of feedback paths), which is chosen for the savings it gives in computations.

First Mode of Operation

As previously described herein, in the first mode of operation, the resource-shared second-order filter structure is configured to operate as an all-pole complex IIR filter. In this mode, each of the mux (switch) US and LS selects the output multiplier from the other section: the upper mux selects the lower multiplier output and lower mux selects the upper multiplier output. The storage elements are clocked appropriately and hold respective bi-quad outputs.

Figure 5A:
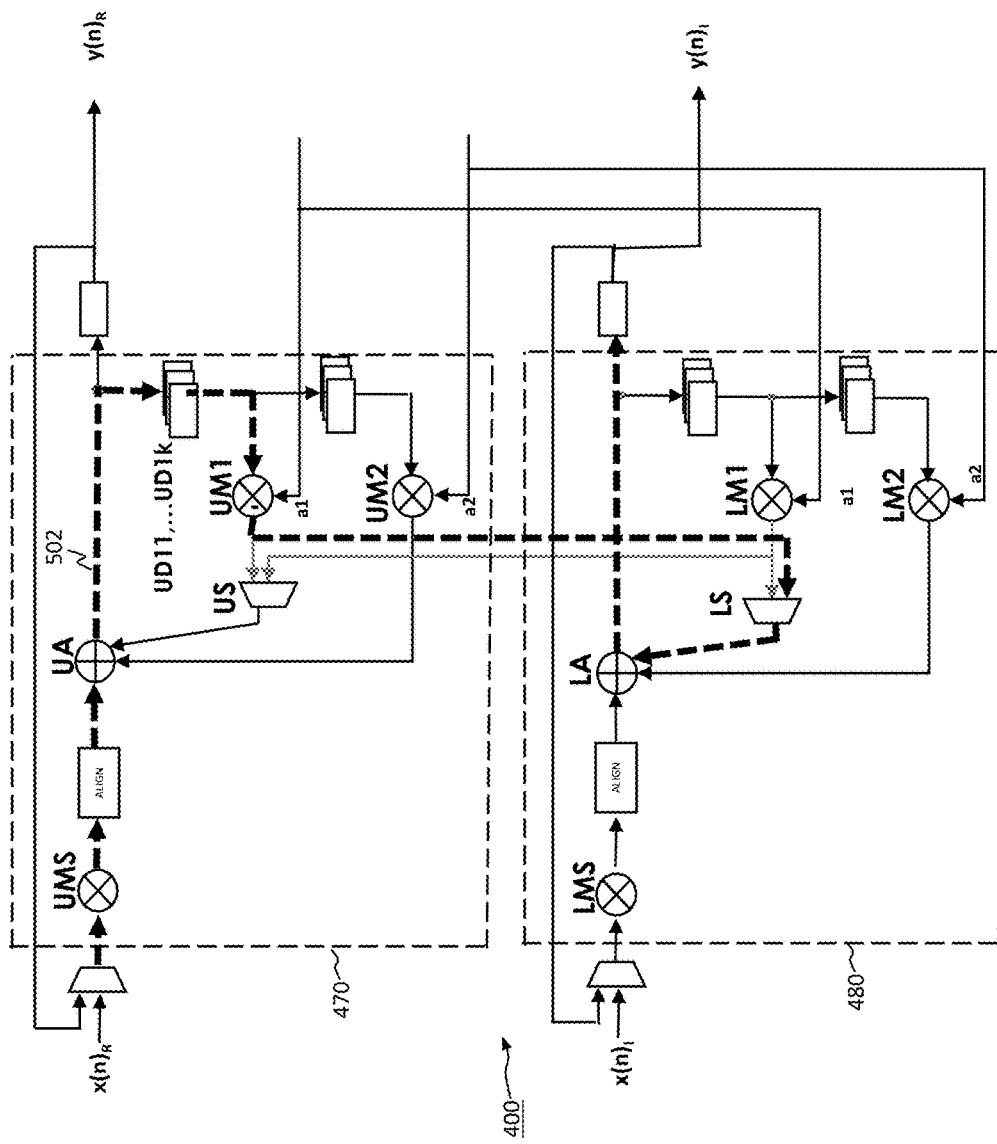
FIGS. 5A and 5B provide a schematic illustration of the core of the digital filter module of FIG. 4 operating as one complex all-pole filter, according to some embodiments of the disclosure.
Figure 5B:
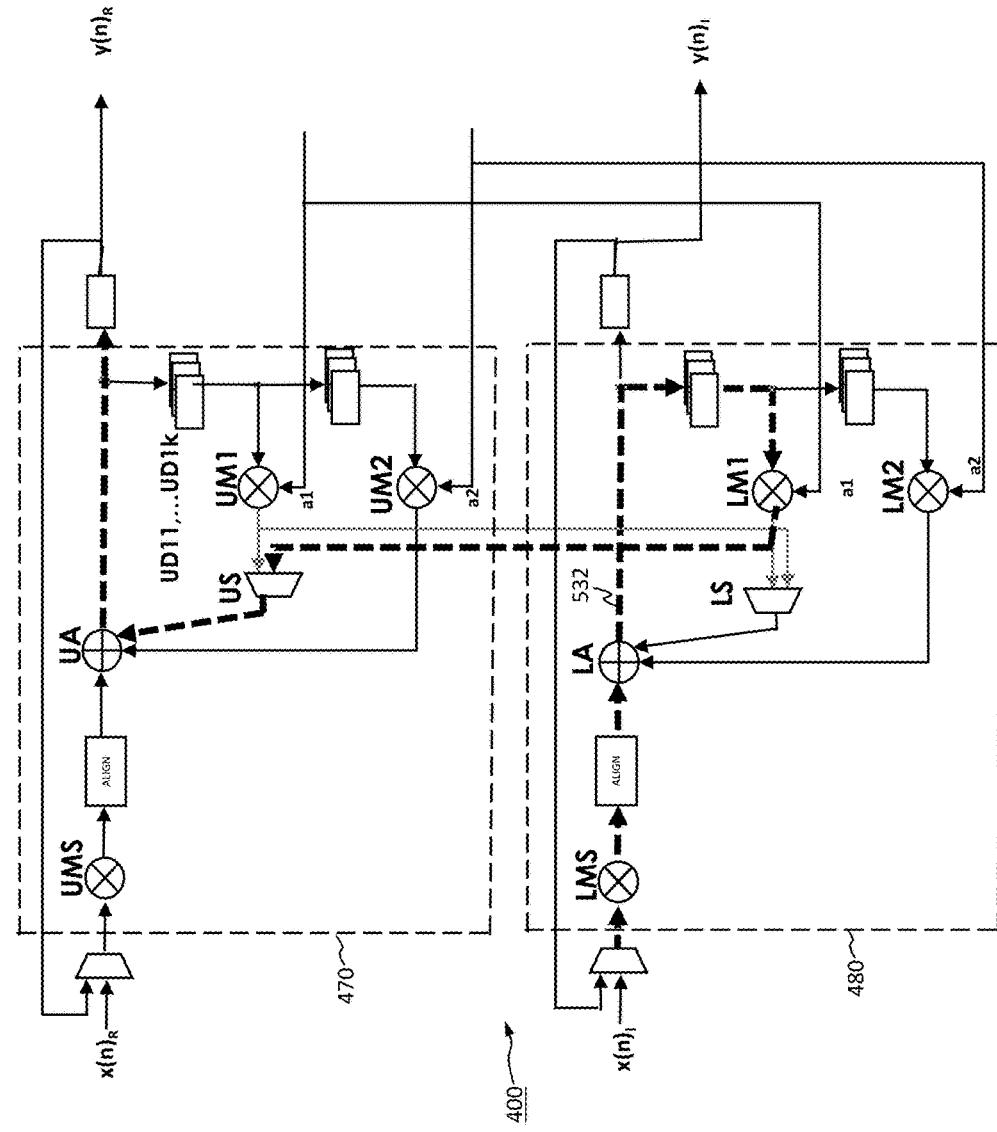

FIGS. 5A and 5B provide a schematic illustration of the core of the digital filter module of FIG. 4 operating as one complex all-pole filter, according to some embodiments of the disclosure. In order to not clutter the drawings, FIGS. 5A and 5B illustrate all of the same components as shown and described in reference to FIG. 4 that are relevant for the explanation of these FIGUREs, but without showing reference numerals which were provided in FIG. 4.

In FIG. 5A, path 502, indicated with thick dashed arrows from element to element of the FIGURE, is a path of processing the digital samples representing the real parts 402 of the received signal. As shown in FIG. 5A, in the path 502, the digital samples 402 are processed, sequentially (i.e. in the order listed, although in principle there could be intermediate elements in between, not shown in the FIGUREs), by the scaling multiplier UMS, the adder UA, the one or more first registers UD11-UD1k, the first multiplier UM1, the selector LS configured to select an output of the first multiplier of the first section UM1 as a consequence of the mode of operation being set to the first mode, e.g. as a result of the selectors US and LS receiving a control signal indicating the first mode of operation, and the adder LA. Thus, in the path 502, the digital samples 402 traverse elements of the digital filter module as follows:

UMS→UA→UD1x→UM1→LS→LA.

In FIG. 5B, path 532, indicated with thick dashed arrows from element to element of the FIGURE, is a path of processing the digital samples representing the imaginary parts 432 of the received signal. As shown in FIG. 5B, in the path 532, the digital samples 432 are processed, sequentially (i.e. in the order listed, although in principle there could be intermediate elements in between, not shown in the FIGUREs), by the scaling multiplier LMS, the adder LA, the one or more first registers LD11-LD1k, the first multiplier LM1, the selector US configured to select an output of the first multiplier of the second section LM1 as a consequence of the mode of operation being set to the first mode, e.g. as a result of the selectors US and LS receiving a control signal indicating the first mode of operation, and the adder UA. Thus, in the path 532, the digital samples 432 traverse elements of the digital filter module as follows:

LMS→LA→LD1x→LM1→US→UA.

FIGS. 5A and 5B only highlight processing of the digital samples that differs in the first and second modes. The digital samples are also processed as indicated by the remaining arrows in these FIGUREs and described above for the general operation of the digital filter module 400. Thus, e.g. the adder of the first section UA is configured to add the output of the first multiplier of the second section LM1 (because this output is selected by the selector of the first section (US)) to an output of processing the digital samples representing the real parts of the signal, sequentially, by the scaling multiplier of the first section (UMS), the one or more second registers of the first section (UD21-UD2k) and the second multiplier of the first section (UM2) that uses the second coefficients a2. Similarly, the adder of the second section (LA) is configured to add the output of the first multiplier of the first section (UM1) (because this output is selected by the selector of the second section (LS)) to an output of processing the digital samples representing the imaginary parts of the signal, sequentially, by the scaling multiplier of the second section (LMS), the one or more second registers of the second section (LD21-LD2k) and the second multiplier of the second section (LM2) that uses the second coefficients a2.

Second Mode of Operation

As previously described herein, in the second mode of operation, the resource-shared second-order filter structure is configured to operate as two all-pole real IIR filters. In this mode, each of the mux (switch) US and LS selects the output multiplier from the same section: the upper mux selects the upper multiplier output and lower mux selects the lower multiplier output. The storage elements are clocked appropriately and hold respective bi-quad outputs. The two sections operate substantially independently in this mode.

Figure 6:
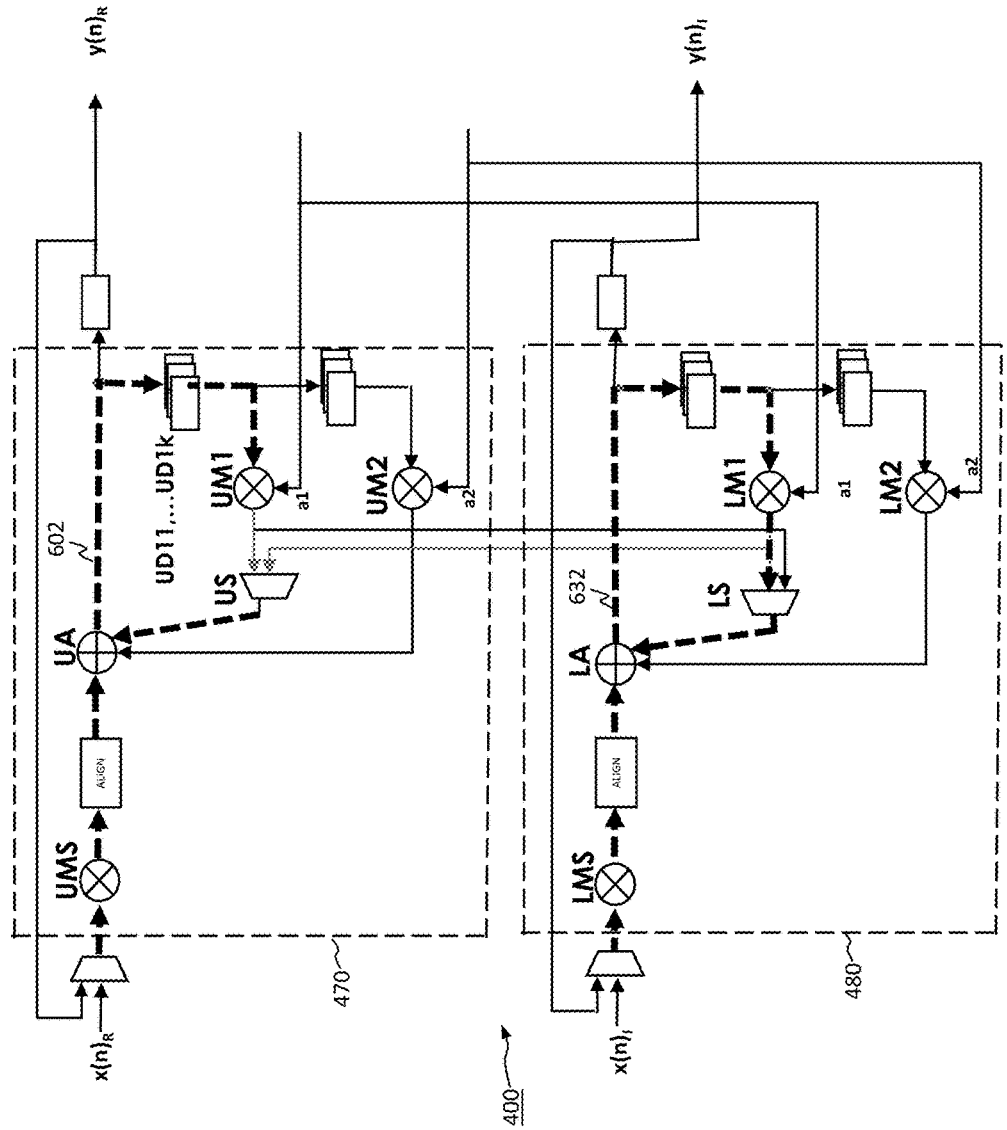
FIG. 6 provides a schematic illustration of the core of the digital filter module of FIG. 4 operating as two real all-pole filters, according to some embodiments of the disclosure.

FIG. 6 provides a schematic illustration of the core of the digital filter module of FIG. 4 operating as two real all-pole filters, according to some embodiments of the disclosure. In order to not clutter the drawings, FIG. 6 illustrates all of the same components as shown and described in reference to FIG. 4 that are relevant for the explanation of this FIGURE, but without showing reference numerals which were provided in FIG. 4.

In FIG. 6, paths 602 and 632, indicated with thick dashed arrows from element to element of the FIGURE, illustrate paths of processing the digital samples representing, respectively, the real parts 402 and the imaginary parts 432 of the received signal.

As shown in FIG. 6, in the path 602, the digital samples 402 are processed, sequentially (i.e. in the order listed, although in principle there could be intermediate elements in between, not shown in the FIGUREs), by the scaling multiplier UMS, the adder UA, the one or more first registers UD11-UD1k, the first multiplier UM1, the selector US configured to select an output of the first multiplier of the first section UM1 as a consequence of the mode of operation being set to the second mode, e.g. as a result of the selectors US and LS receiving a control signal indicating the second mode of operation, and the adder UA. Thus, in the path 602, the digital samples 402 traverse elements of the digital filter module as follows:

UMS→UA→UD1x→UM1→US→UA.

As shown in FIG. 6, in the path 632, the digital samples 432 are processed, sequentially (i.e. in the order listed, although in principle there could be intermediate elements in between, not shown in the FIGUREs), by the scaling multiplier LMS, the adder LA, the one or more first registers LD11-LD1k, the first multiplier LM1, the selector LS configured to select an output of the first multiplier of the second section LM1 as a consequence of the mode of operation being set to the first mode, e.g. as a result of the selectors US and LS receiving a control signal indicating the second mode of operation, and the adder LA. Thus, in the path 632, the digital samples 432 traverse elements of the digital filter module as follows:

LMS→LA→LD1x→LM1→LS→LA.

Similar to FIGS. 5A and 5B, FIG. 6 only highlights processing of the digital samples that differs in the first and second modes. The digital samples are also processed as indicated by the remaining arrows in this FIGURE and described above for the general operation of the digital filter module 400. Thus, e.g. the adder of the first section (UA) is configured to add the output of the first multiplier of the first section (UM1) (because this output is selected by the selector of the first section (US)) to an output of processing the digital samples representing the real parts of the signal, sequentially, by the scaling multiplier of the first section (UMS), the one or more second registers of the first section (UD21-UD2k) and the second multiplier of the first section (UM2). Similarly, the adder of the second section (LA) is configured to add the output of the first multiplier of the second section (LM1) (because this output is selected by the selector of the second section (LS)) to an output of processing the digital samples representing the imaginary parts of the signal, sequentially, by the scaling multiplier of the second section (LMS), the one or more second registers of the second section (LD21-LD2k) and the second multiplier of the second section (LM2).

Relationship Between Sampling and Intermediate Frequencies

Filter optimizations done at system level are the ones which provide maximum benefit. One such optimization used in the digital filter module described herein is that the synthesis of a complex filter is done by frequency translating a real low pass filter which is equivalent to substituting $z^{-1}$ with $z^{-1}e^{j\theta}$ as shown in the equation below:

$$|H_{Real}(z) \xrightarrow{z^{-1}=z^{-1}(\cos\theta+j\sin\theta)} H_{complex}(z) = H_R(z) + jH_I(z)$$

The complex filter coefficients can be greatly optimized by proper selection of sampling frequency (Fs) and Intermediate frequency (IF). If Fs=4×IF, then θ=π/2 and thus making two coefficients trivial (i.e., identical). This results in reduction of two multipliers thereby saving a lot of area and power. The downside is the resolution of IF will be reduced, which is acceptable for the advantages provided in terms of low area and power.

Figure 7A:
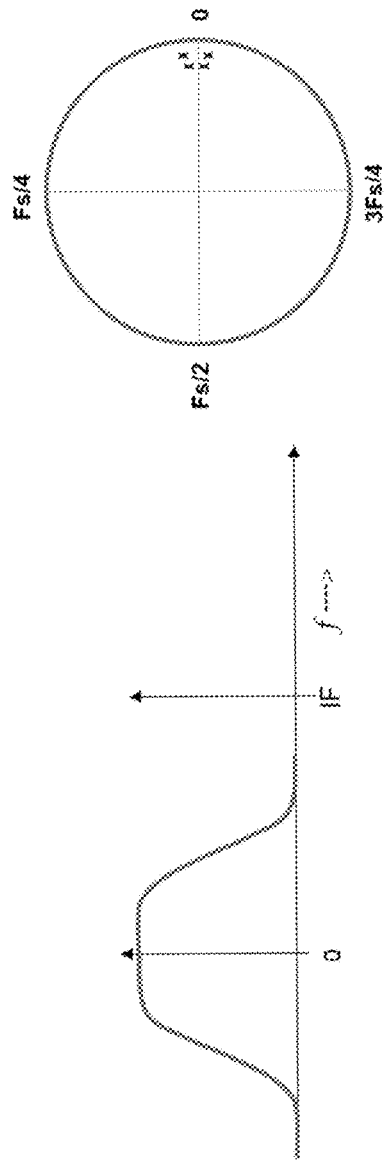
FIGS. 7A and 7B provide a schematic illustration of frequency translation from a real low-pass to complex band-pass, before and after the translation, respectively, according to some embodiments of the disclosure.
Figure 7B:
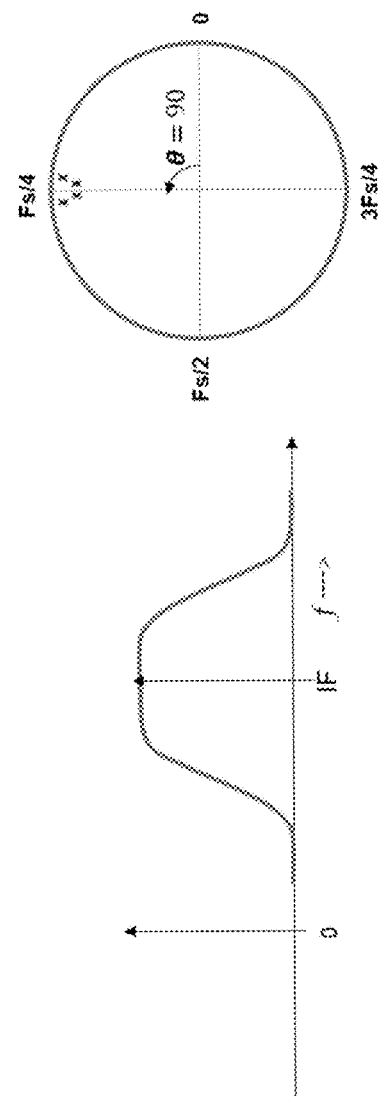
Figure 8:
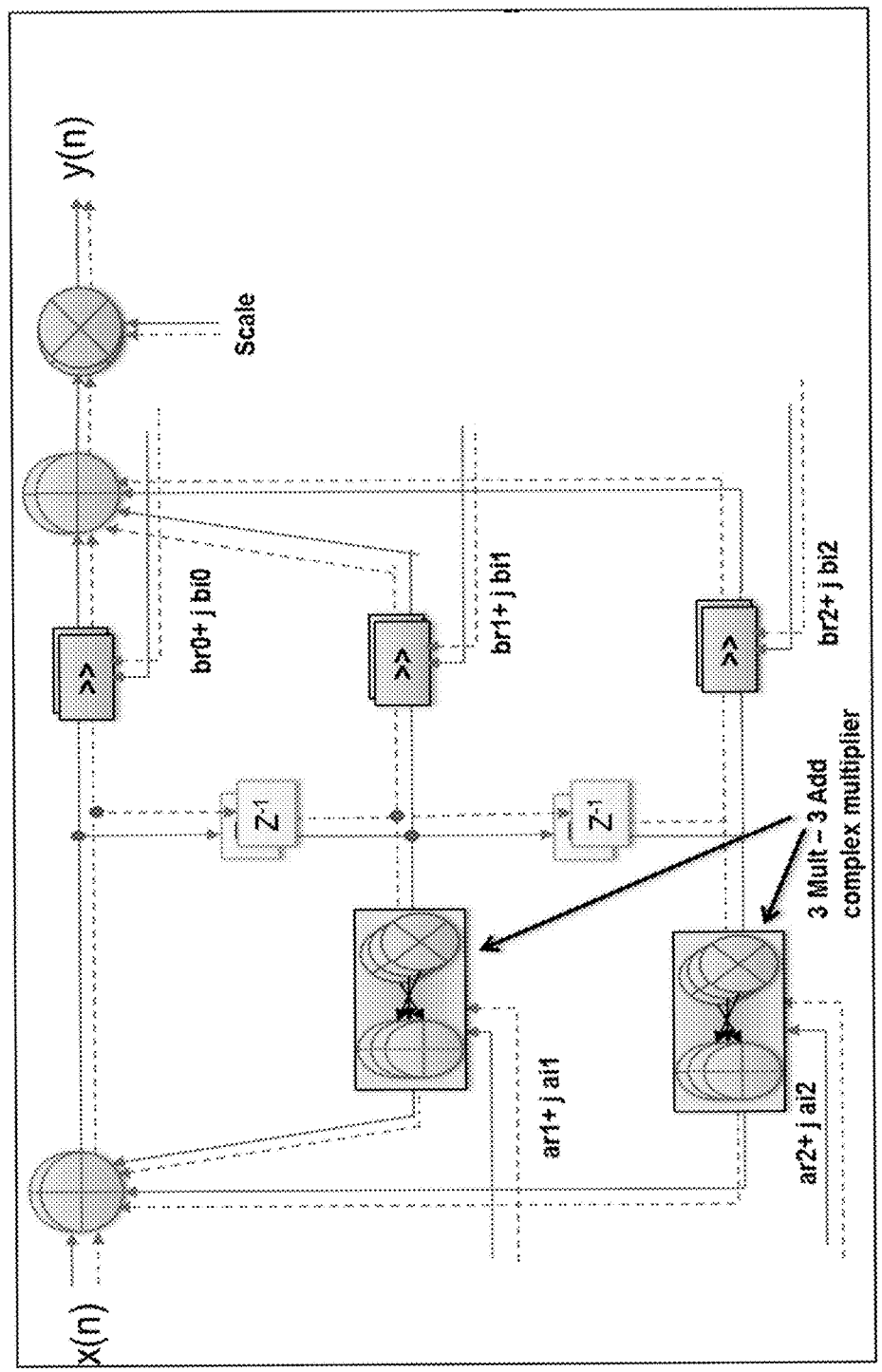
FIG. 8 provides a schematic illustration of implementing both real and complex filters when sampling frequency is not equal four times the intermediate frequency, according to some embodiments of the disclosure.

In other words, one of the key aspects in the architecture of the digital filter module 400 that enables changing configuration from two real to one complex filters is the fact that sampling frequency Fs is equal to 4 times the intermediate frequency IF. The complex filter is synthesized by frequency translation of a real low-pass filter to complex band-pass filter, as shown in the frequency plots of FIGS. 7A-7B. FIG. 7A illustrates a typical digital low-pass filter response and pole locations on z plane before the translation and FIG. 7B—after translation, where If θ=90, $Z^{-1} \to Z^{-1}e^{j\theta} = Z^{-1}(\cos\theta + j\sin\theta) = Z^{-1}(0+j) = jZ^{-1}$ Such a configuration additionally saves two multipliers and provides the ability of changing the configuration from two real to one complex filters. If, on the other hand, a similar digital filter was to be implemented where Fs is not equal to 4×IF, then implementing both real and complex filters in same structure would have required more circuitry. FIG. 8 illustrates a structure with full complex filter for Butterworth and Chebyshev-Type I filters. In order to make such a structure operate as a real filter, multiplexing at both a1 and a2 coefficients would need to take place. Also, other two multipliers and three adders would have to be kept idle, which is not desirable from a power perspective because it would require additional control circuitry. In the implemented filter 400 all of this is avoided by making sure that Fs=4×IF.

Bandwidth Programmability

As is well known, bandwidth of a filter refers to the cutoff frequency of a filter: bandwidth of a pass-band filter is the difference between the upper and lower cutoff frequencies, bandwidth of a low-pass filter is equal to its upper cutoff frequency, and bandwidth of a high-pass filter is equal to its lower cutoff frequency.

Being a digital filter, the filter structure as described herein works on normalized bandwidth. Inventors of the present disclosure realized that, when bandwidth of the receiver changes, for example from 3 kHz to 25 kHz, coefficients a1 and a2 as well as the scale values that need to be provided to the UMS406 and LMS 436 change. As a result, care needs to be taken to make sure that digital samples are aligned before they are processed by the adders UA and LA that add values multiplied by such coefficients.

After careful analysis of scale value precision, a pattern was established where the difference between scale value precision and scaled input precision was either 0 or 1. This was used as an advantage and BW programmability was achieved with a help of a 1-bit shifter. In particular, to allow the digital filter module 400 to be programmable as far as the bandwidth of the filter, as shown in FIG. 4, each of the first and second sections may further include a one-bit shifter 408 or 438, respectively.

A fixed point number may be represented by a format SWL.FL, where "S" refers to the "Sign bit", "WL" refers to the "WordLength" (Actual physical size), and "FL" refers to the "FractionLength" (Value of the least significant bit). Thus, for example notation "S16.15" means there are total 16 bits and value of last bit is $2^{-15}$, while notation "S16.25" means there are total 16 bits and value of last bit is $2^{-25}$, as is schematically illustrated in FIGS. 9A and 9B, respectively. FIGS. 9A and 9B provide a schematic illustration of one example of a fixed point number system used, according to some embodiments of the disclosure.

Figure 10:
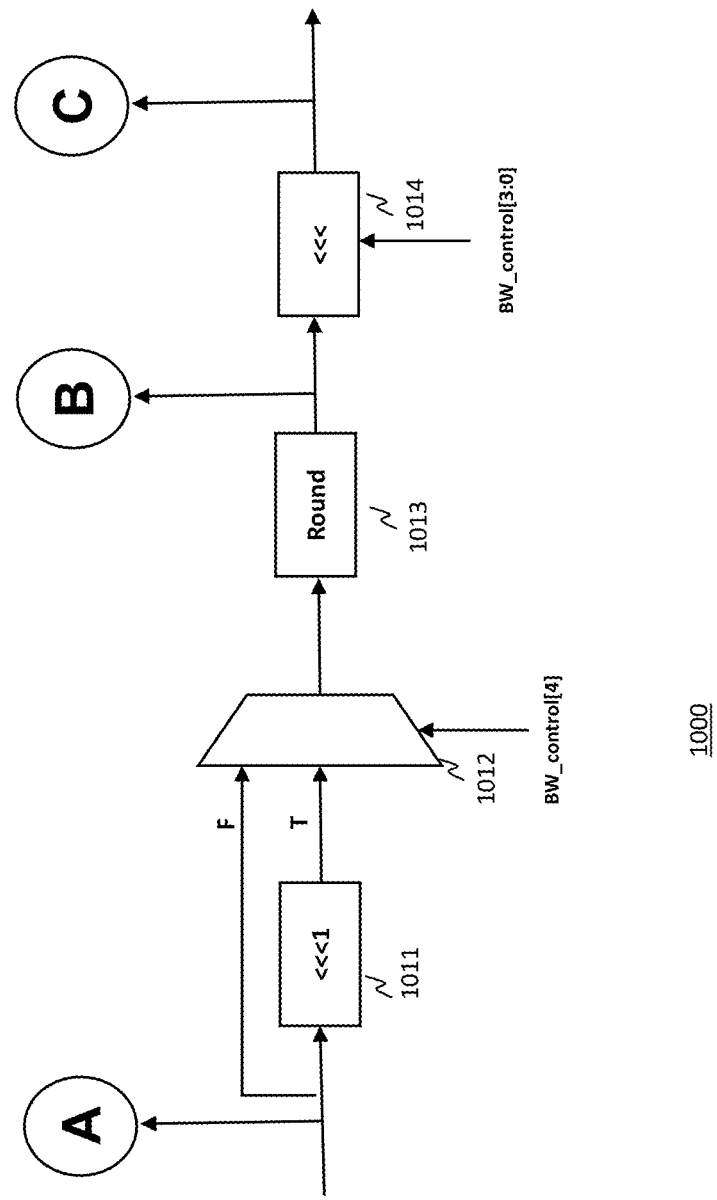
FIG. 10 provides a schematic illustration of an exemplary implementation of bandwidth programmability within an ALIGN block as illustrated in previous FIGUREs, according to some embodiments of the disclosure.

Since the scale value and coefficients vary in precision, i.e. the number of bits needed to express values, over bandwidth, adder (UA/LA) inputs will have to be aligned. FIG. 10 provides a schematic illustration of an exemplary implementation of bandwidth programmability within an ALIGN block as illustrated in previous FIGUREs, according to some embodiments of the disclosure. Logic 1000 shown in FIG. 10 could e.g. be implemented within the ALIGN 408 and 438 illustrated in FIG. 4.

The precision variation between minimum and maximum bandwidth of the filter between points A and B shown in FIG. 10, over all bandwidth, is 1 bit. For example, if the fixed point number at point A is S16,25, then the fixed point number at B will be either S16,25 or S16,26. In another example, if the fixed point number at A is S16,19, then the number at B will be either S16,19 or S16,20. The precision variation at point C shown in FIG. 10, over all bandwidth, is 4 bit. In some embodiments, bandwidth programmability to account for these variations may be achieved by implementing a circuit as shown in FIG. 10, comprising a shifter 1011, a multiplexer 1012, a rounding logic 1013, and a shifter 1014, as well as a control logic (not shown in FIG. 10) configured to generate and provide control signals BW_control[4] and BW_control[3:0] as shown in FIG. 10 to the multiplexer 1012 and the shifter 1014. The control signals BW_control[4] and BW_control[3:0] are generated based on the coefficient values being used, which, as explained above, in turn depend on the bandwidth.

Exemplary Data Processing System

Figure 11:
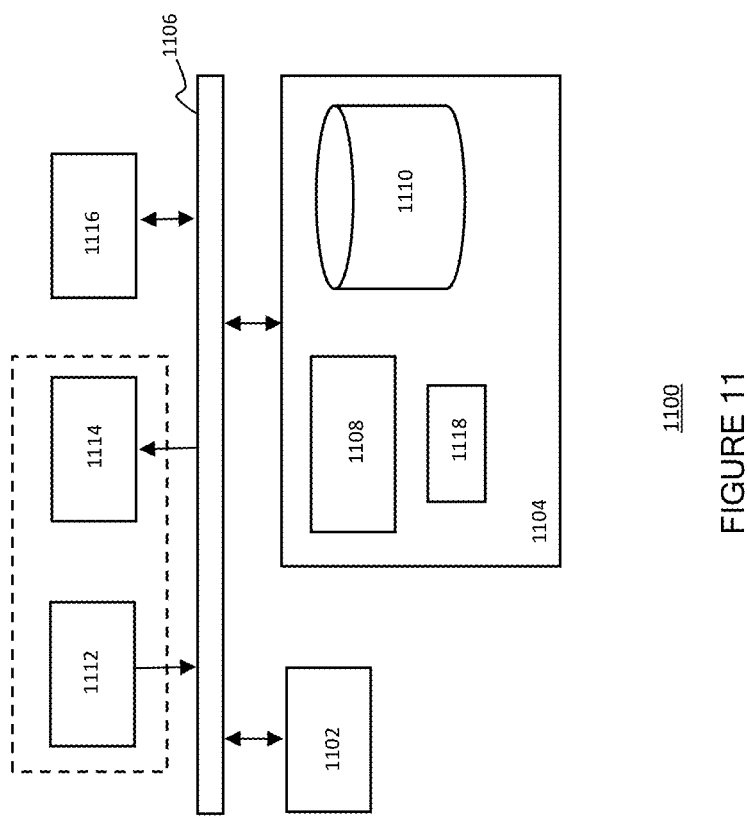
FIG. 11 depicts a block diagram illustrating an exemplary data processing system, according to one embodiment of the present disclosure.

FIG. 11 depicts a block diagram illustrating an exemplary data processing system 1100, according to one embodiment of the present disclosure. Such a data processing system could be configured to e.g. function as the controller described herein or as any other system configured to implement the digital filtering techniques described herein.

As shown in FIG. 11, the data processing system 1100 may include at least one processor 1102 coupled to memory elements 1104 through a system bus 1106. As such, the data processing system may store program code within memory elements 1104. Further, the processor 1102 may execute the program code accessed from the memory elements 1104 via a system bus 1106. In one aspect, the data processing system may be implemented as a computer that is suitable for storing and/or executing program code. It should be appreciated, however, that the data processing system 1100 may be implemented in the form of any system including a processor and a memory that is capable of performing the functions described within this specification.

The memory elements 1104 may include one or more physical memory devices such as, for example, local memory 1108 and one or more bulk storage devices 1110. The local memory may refer to random access memory or other non-persistent memory device(s) generally used during actual execution of the program code. A bulk storage device may be implemented as a hard drive or other persistent data storage device. The processing system 1100 may also include one or more cache memories (not shown) that provide temporary storage of at least some program code in order to reduce the number of times program code must be retrieved from the bulk storage device 1110 during execution.

Input/output (I/O) devices depicted as an input device 1112 and an output device 1114, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 11 with a dashed line surrounding the input device 1112 and the output device 1114). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1116 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1100, and a data transmitter for transmitting data from the data processing system 1100 to said systems, devices and/or networks. Modems, cable modems, and Ethernet cards are examples of different types of network adapter that may be used with the data processing system 1100.

As pictured in FIG. 11, the memory elements 1104 may store an application 1118. In various embodiments, the application 1118 may be stored in the local memory 1108, the one or more bulk storage devices 1110, or apart from the local memory and the bulk storage devices. It should be appreciated that the data processing system 1100 may further execute an operating system (not shown in FIG. 11) that can facilitate execution of the application 1118. The application 1118, being implemented in the form of executable program code, can be executed by the data processing system 1100, e.g., by the processor 1102. Responsive to executing the application, the data processing system 1100 may be configured to perform one or more operations or method steps described herein.

Variations and Implementations

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In one example embodiment, parts or entire electrical circuits of the FIGURES may be implemented on a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, additional sensors, controllers for audio/video display, and peripheral devices may be attached to the motherboard as plug-in cards, via cables, or integrated into the motherboard itself.

In another example embodiment, parts or entire electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that parts or entire electrical circuits of the FIGURES and its teachings are readily scalable and can accommodate a large number of components, as well as more complicated/sophisticated arrangements and configurations. Accordingly, the examples provided should not limit the scope or inhibit the broad teachings of parts or entire electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

What is claimed is:

1. A digital filter module for filtering digital samples of a signal received by a receiver, the filter comprising:
    a resource-shared, at least second-order, filter structure comprising a first section and a second section,
        the first section configured to receive digital samples representing real parts of the signal received by the receiver, and
        the second section configured to receive digital samples representing imaginary parts of the signal received by the receiver,
        the resource-shared second-order filter structure configured to operate, in a first mode, as a complex infinite impulse response (IIR) filter, and, in a second mode, as two real IIR filters; and
    a controller configured to set a mode of operation of the resource-shared second-order filter structure to the first mode or the second mode.

2. The digital filter module according to claim 1, wherein each of the first and second sections comprises a scaling multiplier, an adder, one or more first memory elements, a first multiplier, and a selector.

3. The digital filter module according to claim 2, wherein, in the first mode,
the digital samples representing the real parts of the signal are processed, sequentially, by the scaling multiplier of the first section, the adder of the first section, the one or more first memory elements of the first section, the first multiplier of the first section, the selector of the second section configured to select an output of the first multiplier of the first section, and the adder of the second section, and
the digital samples representing the imaginary parts of the signal are processed, sequentially, by the scaling multiplier of the second section, the adder of the second section, the one or more first memory elements of the second section, the first multiplier of the second section, the selector of the first section configured to select an output of the first multiplier of the second section, and the adder of the first section.

4. The digital filter module according to claim 3, wherein, each of the first and second sections further comprises one or more second memory elements and a second multiplier, and wherein,
the adder of the first section is configured to add the output of the first multiplier of the second section to an output of processing the digital samples representing the real parts of the signal, sequentially, by the one or more second memory elements of the first section and the second multiplier of the first section, and
the adder of the second section is configured to add the output of the first multiplier of the first section to an output of processing the digital samples representing the imaginary parts of the signal, sequentially, by the one or more second memory elements of the second section and the second multiplier of the second section.

5. The digital filter module according to claim 2, wherein, in the second mode,
the digital samples representing the real parts of the signal are processed, sequentially, by the scaling multiplier of the first section, the adder of the first section, the one or more first memory elements of the first section, the first multiplier of the first section, the selector of the first section configured to select an output of the first multiplier of the first section, and the adder of the first section, and
the digital samples representing the imaginary parts of the signal are processed, sequentially, by the scaling multiplier of the second section, the adder of the second section, the one or more first memory elements of the second section, the first multiplier of the second section, the selector of the second section configured to select an output of the first multiplier of the second section, and the adder of the second section.

6. The digital filter module according to claim 5, wherein, each of the first and second sections further comprises one or more second memory elements and a second multiplier, and wherein,
the adder of the first section is configured to add the output of the first multiplier of the first section to an output of processing the digital samples representing the real parts of the signal, sequentially, by the one or more second memory elements of the first section and the second multiplier of the first section, and
the adder of the second section is configured to add the output of the first multiplier of the second section to an output of processing the digital samples representing the imaginary parts of the signal, sequentially, by the one or more second memory elements of the second section and the second multiplier of the second section.

7. The digital filter module according to claim 1, wherein each of the first and second sections of the resource-shared second order filter structure is implemented as a Butterworth filter or a Chebyshev type I filter.

8. The digital filter module according to claim 1, wherein the digital filter module is configured to operate as a 2k-order filter, where k is an integer equal to or greater than 1.

9. The digital filter module according to claim 1, wherein the digital samples received by the first section and the digital samples received by the second section are sampled at a sampling frequency equal to four times an intermediate frequency of the receiver.

10. The digital filter module according to claim 9, wherein the complex IIR filter is an all-pole complex IIR filter, and wherein two real IIR filters are two real . all-pole IIR filters.

11. A receiver comprising a digital filter module for filtering digital samples of a signal received by a receiver, the filter comprising:
a resource-shared, at least second-order, filter structure comprising a first section and a second section,
the first section configured to receive digital samples representing real parts of the signal received by the receiver, and
the second section configured to receive digital samples representing imaginary parts of the signal received by the receiver,
the resource-shared second-order filter structure configured to operate, in a first mode, as a complex infinite impulse response (IIR) filter, and, in a second mode, as two real IIR filters; and
a controller configured to set a mode of operation of the resource-shared second-order filter structure to the first mode or the second mode.

12. The receiver according to claim 11, wherein the digital samples received by the first section and the digital samples received by the second section are sampled at a sampling frequency equal to four times an intermediate frequency of the receiver.

13. The receiver according to claim 12, wherein the complex IIR filter is an all-pole complex IIR filter, and wherein two real IIR filters are two real all-pole IIR filters.

14. The receiver according to claim 13, wherein the digital filter module is configured to filter the signal received by the receiver by rejecting or decreasing components outside of a first band of frequencies, the receiver further comprising an analog filter configured to filter the signal received by the receiver by rejecting or decreasing components outside of a second band of frequencies, the second band of frequencies being larger than the first band of frequencies.

15. The receiver according to claim 14, wherein the receiver is an electromagnetic receiver, and wherein the first band of frequencies is between 3 kHz and 25 kHz.

16. The receiver according to claim 14, wherein:
the receiver is configured to be operated in a narrow-bandwidth mode and in a wide-bandwidth mode,
the receiver is configured to use the digital filter module to filter the signal received by the receiver when operating in the narrow-bandwidth mode, and
the receiver is configured to use the analog filter to filter the signal received by the receiver when operating in the wide-bandwidth mode.

17. The receiver according to claim 13, wherein each of the first and second sections comprises a scaling multiplier, an adder, one or more first memory elements, a first multiplier, and selector.

18. The receiver according to claim 17, wherein, in the first mode,
the digital samples representing the real parts of the signal are processed, sequentially, by the scaling multiplier of the first section, the adder of the first section, the one or more first memory elements of the first section, the first multiplier of the first section, the selector of the second section configured to select an output of the first multiplier of the first section, and the adder of the second section, and
the digital samples representing the imaginary parts of the signal are processed, sequentially, by the scaling multiplier of the second section, the adder of the second section, the one or more first memory elements of the second section, the first multiplier of the second section, the selector of the first section configured to select an output of the first multiplier of the second section, and the adder of the first section.

19. The receiver according to claim 18, wherein, each of the first and second sections further comprises one or more second memory elements and a second multiplier, and wherein,
the adder of the first section is configured to add the output of the first multiplier of the second section to an output of processing the digital samples representing the real parts of the signal, sequentially, by the one or more second memory elements of the first section and the second multiplier of the first section, and
the adder of the second section is configured to add the output of the first multiplier of the first section to an output of processing the digital samples representing the imaginary parts of the signal, sequentially, by the one or more second memory elements of the second section and the second multiplier of the second section.

20. The receiver according to claim 17, wherein, in the second mode,
the digital samples representing the real parts of the signal are processed, sequentially, by the scaling multiplier of the first section, the adder of the first section, the one or more first memory elements of the first section, the first multiplier of the first section, the selector of the first section configured to select an output of the first multiplier of the first section, and the adder of the first section, and
the digital samples representing the imaginary parts of the signal are processed, sequentially, by the scaling multiplier of the second section, the adder of the second section, the one or more first memory elements of the second section, the first multiplier of the second section, the selector of the second section configured to select an output of the first multiplier of the second section, and the adder of the second section.

21. The receiver according to claim 20, wherein, each of the first and second sections further comprises one or more second memory elements and a second multiplier, and wherein,
the adder of the first section is configured to add the output of the first multiplier of the first section to an output of processing the digital samples representing the real parts of the signal, sequentially, by the one or more second memory elements of the first section and the second multiplier of the first section, and
the adder of the second section is configured to add the output of the first multiplier of the second section to an output of processing the digital samples representing the imaginary parts of the signal, sequentially, by the one or more second memory elements of the second section and the second multiplier of the second section.

22. The receiver according to claim 13, wherein each of the first and second sections of the resource-shared second order filter structure is implemented as a Butterworth filter or a Chebyshev type I filter.

23. The receiver according to claim 13, wherein the digital filter module is configured to operate as a 2k-order filter, where k is an integer equal to or greater than 1.

* * * * *